United States Patent
Kim et al.

(10) Patent No.: US 8,809,892 B2
(45) Date of Patent: Aug. 19, 2014

(54) LIGHT EMITTING DIODE AND METHOD OF FABRICATING THE SAME

(75) Inventors: Do Hyung Kim, Ansan (KR); Chung-Hoon Lee, Ansan (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 0 days.

(21) Appl. No.: 13/115,084

(22) Filed: May 24, 2011

(65) Prior Publication Data

US 2011/0227123 A1    Sep. 22, 2011

Related U.S. Application Data

(63) Continuation of application No. 11/994,813, filed as application No. PCT/KR2005/003784 on Nov. 9, 2005, now Pat. No. 8,058,662.

(30) Foreign Application Priority Data

Jul. 4, 2005  (KR) .......................... 10-2005-0059736

(51) Int. Cl.
  *H01L 33/62*   (2010.01)
  *H01L 33/50*   (2010.01)
  *H01L 33/54*   (2010.01)

(52) U.S. Cl.
  CPC .............. *H01L 33/505* (2013.01); *H01L 33/62* (2013.01); *H01L 2224/48247* (2013.01); *H01L 2224/45139* (2013.01); *H01L 33/54* (2013.01); *H01L 2224/8592* (2013.01); *H01L 2933/0041* (2013.01); *H01L 2224/48091* (2013.01)
  USPC ........................................... 257/99; 257/100

(58) Field of Classification Search
  USPC .............................................. 257/99, E33.058
  See application file for complete search history.

(56) References Cited

U.S. PATENT DOCUMENTS 5,040,868 A  *  8/1991  Waitl et al. ....................... 385/33
5,813,753 A  *  9/1998  Vriens et al. ................... 362/293
5,949,655 A     9/1999  Glenn (Continued)

FOREIGN PATENT DOCUMENTS

EP    1198016     4/2002
EP    1 408 559   4/2004

(Continued)

OTHER PUBLICATIONS

International Search Report of PCT/KR2005/003784 issued on Apr. 3, 2006.

(Continued)

*Primary Examiner* — Long K Tran
*Assistant Examiner* — Jordan Klein
(74) *Attorney, Agent, or Firm* — H.C. Park & Associates, PLC

(57) ABSTRACT

The present invention relates to a light emitting diode and a method of fabricating the same, wherein the distance between a fluorescent substance and a light emitting diode chip is uniformly maintained to enhance luminous efficiency. To this end, there is provided a light emitting diode comprising at least one light emitting diode chip, lead terminals for use in applying electric power to the light emitting diode chip, and a frame that is used for mounting the light emitting diode chip thereon and is formed to have a predetermined height and a shape corresponding to that of the light emitting diode chip.

17 Claims, 9 Drawing Sheets

(56) References Cited

U.S. PATENT DOCUMENTS

| | | | |
|---|---|---|---|
| 6,396,082 B1* | 5/2002 | Fukasawa et al. | 257/79 |
| 6,610,563 B1* | 8/2003 | Waitl et al. | 438/166 |
| 6,627,814 B1 | 9/2003 | Stark | |
| 6,650,044 B1 | 11/2003 | Lowery | |
| 6,835,960 B2 | 12/2004 | Lin et al. | |
| 6,900,511 B2* | 5/2005 | Ruhnau et al. | 257/432 |
| 6,943,380 B2* | 9/2005 | Ota et al. | 257/100 |
| 6,946,714 B2* | 9/2005 | Waitl et al. | 257/434 |
| 7,045,905 B2* | 5/2006 | Nakashima | 257/787 |
| 7,075,225 B2* | 7/2006 | Baroky et al. | 313/503 |
| 7,166,873 B2* | 1/2007 | Okazaki | 257/98 |
| 7,227,190 B2* | 6/2007 | Yasukawa et al. | 257/79 |
| 7,279,346 B2* | 10/2007 | Andrews et al. | 438/27 |
| 7,326,583 B2* | 2/2008 | Andrews et al. | 438/26 |
| 7,391,153 B2* | 6/2008 | Suehiro et al. | 313/512 |
| 7,429,758 B2* | 9/2008 | Ruhnau et al. | 257/98 |
| 7,550,777 B2* | 6/2009 | Kato et al. | 257/99 |
| 7,675,132 B2* | 3/2010 | Waitl et al. | 257/434 |
| 7,679,281 B2* | 3/2010 | Kim et al. | 313/501 |
| 7,714,342 B2* | 5/2010 | Lee et al. | 257/98 |
| 2001/0050371 A1 | 12/2001 | Odaki et al. | |
| 2004/0051111 A1* | 3/2004 | Ota et al. | 257/98 |
| 2004/0263073 A1* | 12/2004 | Baroky et al. | 313/512 |
| 2005/0056858 A1* | 3/2005 | Kakiuchi et al. | 257/100 |
| 2005/0133808 A1* | 6/2005 | Uraya et al. | 257/99 |
| 2005/0219835 A1 | 10/2005 | Nagayama | |
| 2005/0269589 A1* | 12/2005 | Wu | 257/99 |
| 2006/0170332 A1* | 8/2006 | Tamaki et al. | 313/498 |
| 2006/0220050 A1* | 10/2006 | Higaki et al. | 257/99 |

FOREIGN PATENT DOCUMENTS

| | | | | |
|---|---|---|---|---|
| JP | 03-161958 | | 7/1991 | |
| JP | 08-032120 | | 2/1996 | |
| JP | 08032120 A | * | 2/1996 | H01L 33/00 |
| JP | 08-148724 | | 6/1996 | |
| JP | 08-293626 | | 11/1996 | |
| JP | 11-040848 | | 2/1999 | |
| JP | 2000-022217 | | 1/2000 | |
| JP | 2000022217 A | * | 1/2000 | H01L 33/00 |
| JP | 2000-208822 | | 7/2000 | |
| JP | 2001-135861 | | 5/2001 | |
| JP | 2001-308393 | | 11/2001 | |
| JP | 2002-314142 | | 10/2002 | |
| JP | 2002-329892 | | 11/2002 | |
| JP | 2003-258312 | | 9/2003 | |
| JP | 2003-303999 | | 10/2003 | |
| JP | 2004-015063 | | 1/2004 | |
| JP | 2004-127988 | | 4/2004 | |
| JP | 2004-153090 | | 5/2004 | |
| JP | 2004-253745 | | 9/2004 | |
| JP | 2004-343059 | | 12/2004 | |
| JP | 2004-363343 | | 12/2004 | |
| JP | 2005-019997 | | 1/2005 | |
| JP | 2005-057265 | | 3/2005 | |
| JP | 3653090 | | 3/2005 | |
| JP | 2005-091675 | | 4/2005 | |
| JP | 2005-093728 | | 4/2005 | |
| JP | 2005-116817 | | 4/2005 | |
| JP | 2005-123560 | | 5/2005 | |
| JP | 2005-158949 | | 6/2005 | |
| JP | 2005-159263 | | 6/2005 | |
| JP | 2005-159276 | | 6/2005 | |
| JP | 2005-175292 | | 6/2005 | |
| JP | 2005-300321 | | 10/2005 | |
| JP | 2008-521210 | | 6/2008 | |
| WO | 2004/068594 | | 8/2004 | |
| WO | 2006/054616 | | 5/2006 | |

OTHER PUBLICATIONS

Non-Final Office Action of U.S. Appl. No. 11/994,813 issued on Jun. 9, 2009.
Final Office Action of U.S. Appl. No. 11/994,813 issued on Jan. 21, 2010.
Non-Final Office Action of U.S. Appl. No. 11/994,813 issued on Feb. 17, 2011.
European Search Report dated Dec. 17, 2010 in corresponding application No. EP 05 82 0596.
Notice of Allowance of U.S. Appl. No. 11/994,813 issued on Aug. 18, 2011.
European Patent Office Action dated Jun. 19, 2013 for EP Application No. 05 820 596.4.

* cited by examiner

LIGHT EMITTING DIODE AND METHOD OF FABRICATING THE SAME

CROSS REFERENCE TO RELATED APPLICATIONS

This application is a continuation of U.S. patent application Ser. No. 11/994,813, filed on Jan. 4, 2008, which is the National Stage of International Application No. PCT/KR2005/003784 filed on Nov. 9, 2005 and claims the benefit of and priority from Korean Patent Application No. 10-2005-0059736, filed Jul. 4, 2005 which are all hereby incorporated by reference for all purposes as if fully set forth herein.

TECHNICAL FIELD

The present invention relates to a light emitting diode and a method of fabricating the same, and more particularly, to a light emitting diode with a frame structure for allowing uniform application of a fluorescent substance thereon and a method of fabricating the light emitting diode.

BACKGROUND ART

FIGS. 1 and 2 are schematic sectional views of light emitting diodes in which a fluorescent substance is applied in accordance with a prior art. FIG. 1 is a sectional view of a conventional top-type light emitting diode and FIG. 2 is a sectional view of a conventional lamp-type light emitting diode.

Referring to FIG. 1, the light emitting diode comprises a substrate 10 with first and second lead terminals 30 and 35 formed thereon, a light emitting diode chip 20 mounted on the substrate 10, and a reflecting portion 40 formed on the substrate to surround the light emitting diode chip 20. The light emitting diode chip 20 is electrically connected to the first and second lead terminals 30 and 35 through wires 70. A molding portion 60 is formed on the light emitting diode chip 20 by filling a liquid epoxy resin or the like into the reflecting portion 40 and thermally curing the resin for a predetermined time so as to protect the light emitting diode chip 20. Further, a fluorescent substance 50 for absorbing light emitted from the light emitting diode chip 20 and performing wavelength conversion of the light into respective different wavelengths is mixed in the molding portion 60.

Referring to FIG. 2, the light emitting diode comprises a first lead terminal 80 with a reflecting portion 40 at an upper end thereof and a second lead terminal 85 spaced apart by a predetermined distance from the first lead terminal 80. Further, a light emitting diode chip 20 is mounted inside the reflecting portion 40 of the first lead terminal 80, and a molding portion 60 is formed on the light emitting diode chip 20 by applying a liquid epoxy resin or the like and thermally curing the resin for a predetermined time so as to protect the light emitting diode chip 20. Further, a fluorescent substance 50 for absorbing light emitted from the light emitting diode chip 20 and performing wavelength conversion of the light into respective different wavelengths is mixed in the molding portion 60.

When the fluorescent substance is applied as described above, the fluorescent substance with a higher specific gravity precipitates due to a difference in specific gravity between the fluorescent substance and the epoxy resin with a relatively lower specific gravity during the predetermined time when the liquid epoxy resin is cured. A difference in concentration within the liquid epoxy resin occurs due to such precipitation of the fluorescent substance, and thus, there is a problem with color reproducibility because light emitted from the light emitting diode chip is not uniform. Further, since a color speckle is produced, a great amount of fluorescent substance should be contained in the molding portion to express a uniform color, resulting in degradation of light emitting efficiency. Furthermore, since the fluorescent substance is not uniformly distributed, there is a problem in that the color of light emitted from the light emitting diode varies depending on an angle at which the light emitting diode is viewed.

FIGS. 3 and 4 are schematic sectional views of light emitting diodes in which a fluorescent substance is applied in accordance with another prior art. The light emitting diodes shown in FIGS. 3 and 4 are different from those shown in FIGS. 1 and 2 in that a mixture of a fluorescent substance and a resin is dotted with a predetermined thickness to encapsulate a light emitting diode chip and a molding portion is then formed thereon. However, remaining components of the light emitting diodes shown in FIGS. 3 and 4 are identical to those of the light emitting diodes shown in FIGS. 1 and 2.

Referring to FIG. 3, in the light emitting diode, the mixture of fluorescent substance and resin is dotted on the light emitting diode chip 20, and the molding portion 65 is formed inside a reflecting portion 40. Referring to FIG. 4, the fluorescent substance 50 is injected only inside the reflecting portion 40, and a transparent epoxy resin is used for the peripheral molding portion 65 to enhance the transmissivity of light emitted from the light emitting diode chip 20.

In the case where the mixture of fluorescent substance and resin is applied as described above, the mixture may flow laterally. Thus, there is a problem in that the distance between the light emitting diode and the fluorescent substance varies and thus a color may not be uniformly expressed and two or more different colors may be produced depending on a light emitting region. Further, in case of FIG. 4, the luminous efficiency of light considerably decreases due to interference between the light emitting diode chip and the reflecting portion.

FIG. 5 is a schematic sectional view of a light emitting diode in which a fluorescent substance is applied in accordance with a further prior art. The light emitting diode of FIG. 5 further comprises a guide member 90 for preventing a mixture of fluorescent substance and resin from flowing outside a substrate or lead terminals when the mixture of fluorescent substance and resin is dotted on a light emitting diode chip. However, since an additional process should be added to attach the guide member 90, a fabricating process becomes complicated, resulting in increased production costs. Further, there is a problem in that luminous efficiency decreases and a great amount of fluorescent substance is consumed due to the guide member.

DISCLOSURE OF INVENTION

The present invention is conceived to solve the aforementioned problems in the prior arts. Accordingly, an object of the present invention is to provide a light emitting diode and a method of fabricating the same, wherein the distance between a fluorescent substance and a light emitting diode chip is uniformly maintained when the fluorescent substance is applied to the light emitting diode, thereby reducing a color variation, i.e., generation of two or more different colors, and enhancing luminous efficiency.

According to one aspect of the present invention for achieving the object, there is provided a light emitting diode, comprising at least one light emitting diode chip; lead terminals for use in applying electric power to the light emitting diode chip; and a frame that is used for mounting the light emitting diode chip thereon and is formed to have a predetermined height and a shape corresponding to that of the light emitting diode chip.

The light emitting diode may further comprise a molding portion that has a fluorescent substance for converting the wavelength of light emitted from the light emitting diode chip and is formed on the fame.

The light emitting diode may further comprise a peripheral molding portion for encapsulating the light emitting diode chip.

The molding portion may be formed to have a shape corresponding to that of the light emitting diode chip.

The frame may be formed on one of the lead terminals.

The frame and the lead terminals may be formed integrally with each other.

The light emitting diode may further comprise a substrate and the frame may be formed on the substrate.

The frame and the substrate may be formed integrally with each other.

The light emitting diode may further comprise a housing for surrounding the substrate.

A barrier with a predetermined height may be formed along the periphery of a top surface of the frame.

The barrier and the frame may be formed integrally with each other.

The frame may be formed to have a rectangular shape.

A groove with a predetermined depth may be formed along the periphery of a top surface of the frame.

According to another aspect of the present invention, there is provided a method of fabricating a light emitting diode, comprising the steps of forming a frame with a shape corresponding to that of a light emitting diode chip; mounting the light emitting diode chip on the frame; applying a predetermined amount of fluorescent substance on the frame; and heating and curing the fluorescent substance.

A barrier with a predetermined height may be formed along the periphery of a top surface of the frame.

A groove with a predetermined depth may be formed along the periphery of a top surface of the frame.

BEST MODE FOR CARRYING OUT THE INVENTION

Hereinafter, preferred embodiments of the present invention will be described in detail with reference to the accompanying drawings.

Figure 1:
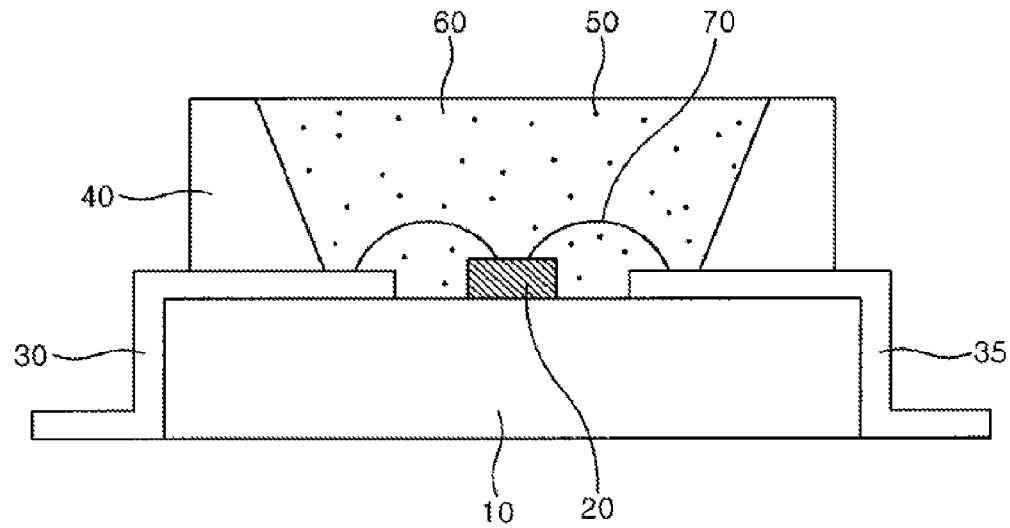
FIGS. 1 and 2 are schematic sectional views of light emitting diodes in which a fluorescent substance is applied in accordance with a prior art.
Figure 2:
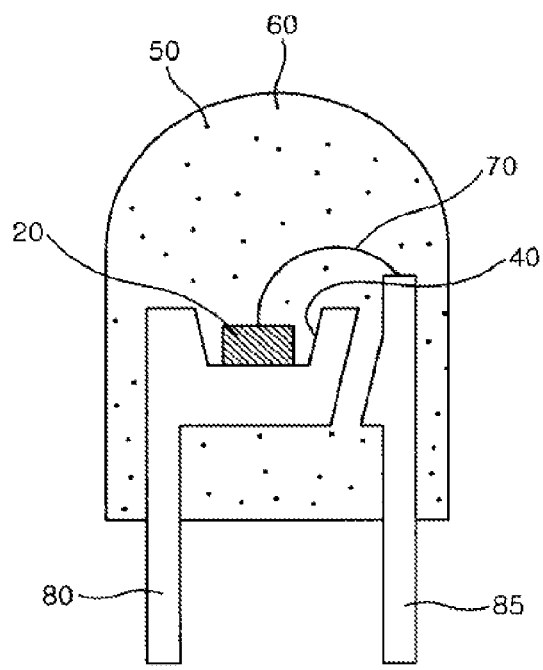
Figure 3:
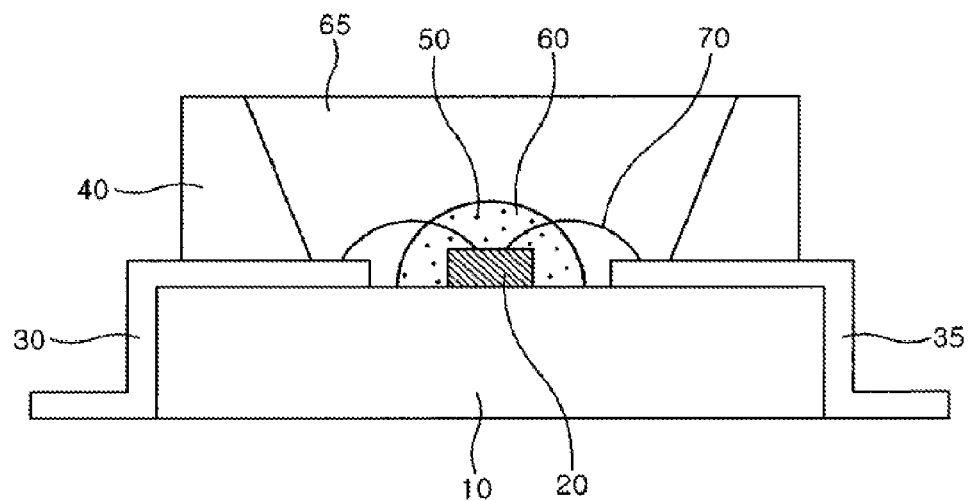
FIGS. 3 and 4 are schematic sectional views of light emitting diodes in which a fluorescent substance is applied in accordance with another prior art.
Figure 4:
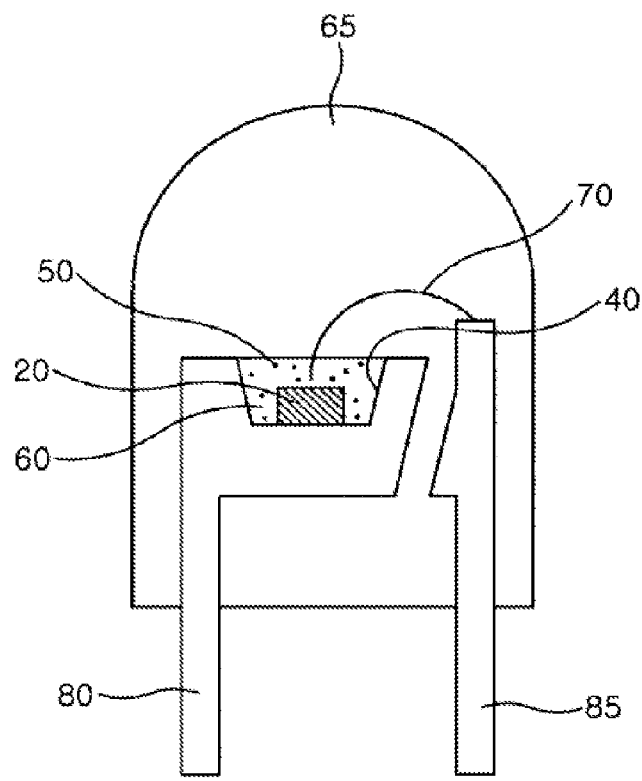
Figure 5:
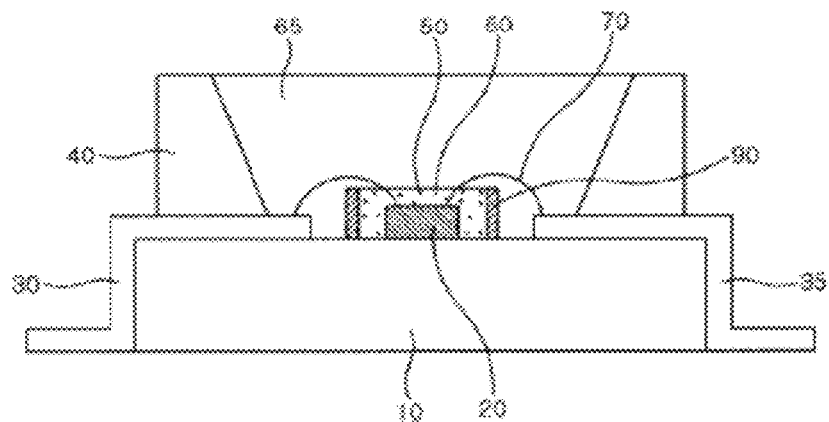
FIG. 5 is a schematic sectional view of a light emitting diode in which a fluorescent substance is applied in accordance with a further prior art.
Figure 6:
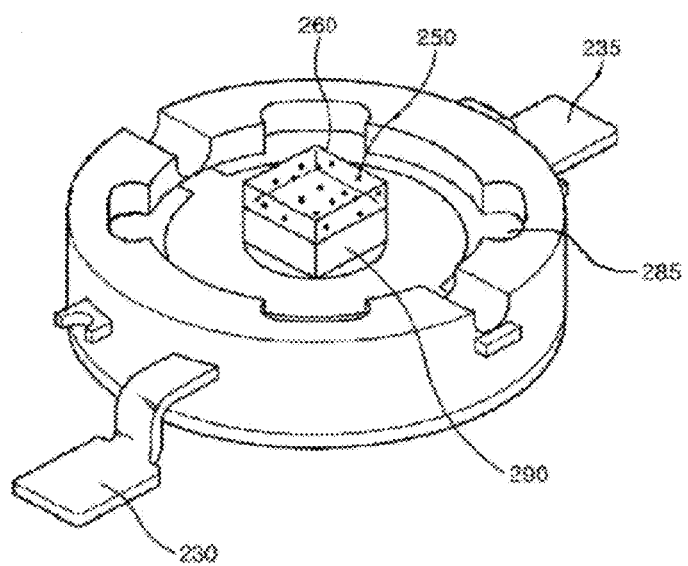
FIGS. 6 and 7 are a perspective view and a sectional view of a light emitting diode according to a first embodiment of the present invention, respectively.
Figure 7:
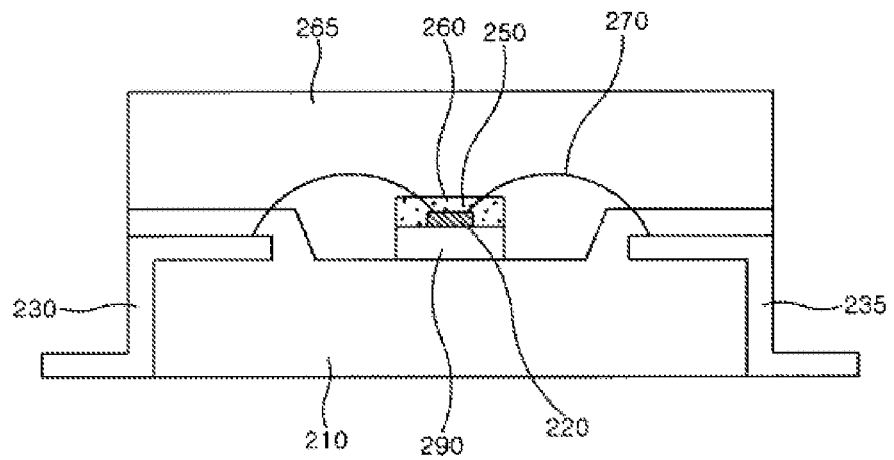

FIGS. 6 and 7 are a perspective view and a sectional view of a light emitting diode according to a first embodiment of the present invention, respectively. That is, the figures are a perspective view and a sectional view of a chip-type light emitting diode according to the present invention, respectively.

Referring to FIGS. 6 and 7, the light emitting diode comprises a substrate 210 with lead terminals 230 and 235 formed thereon, a frame 290 formed on the substrate 210, a light emitting diode chip 220 mounted on the frame 290, and wires 270 for connecting the light emitting diode chip 220 to the lead terminals 230 and 235. Further, a fluorescent substance 250 for converting the wavelength of light generated from the light emitting diode chip 220 is mixed with an encapsulant and then applied to the frame 290 to form a molding portion 260. Although the light emitting diode of this embodiment includes one light emitting diode chip 220, it is only for illustrative purposes and the light emitting diode may include a plurality of light emitting diode chips 220. The substrate 210 includes at least one groove 285.

Further, a peripheral molding portion 265 is formed of a liquid epoxy resin or the like on the light emitting diode chip 220 to protect the light emitting diode chip 220. The peripheral molding portion 265 may be formed through an injection molding process using a predetermined resin, or through preparation thereof using an additional mold and subsequent pressurization or heat-treatment thereof. In this case, the peripheral molding portion 265 is formed using an epoxy resin, a silicone resin or the like. The peripheral molding portion 265 may be formed in various forms such as an optical lens or a flat plate.

Meanwhile, the frame 290 may be formed separately from the substrate 210 and then bonded thereto. Otherwise, the frame 290 and the substrate 210 may be formed integrally with each other. In this case, the substrate 210 may be formed using a metal slug or a thermally conductive resin.

Further, the encapsulant is made of a liquid epoxy resin or silicone resin.

Figure 8:
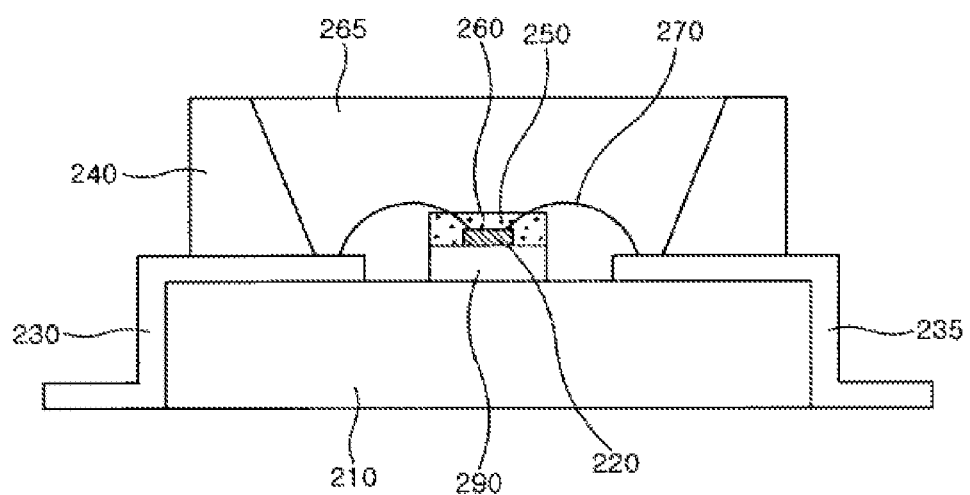
FIG. 8 is a sectional view of a light emitting diode according to a second embodiment of the present invention.

FIG. 8 is a sectional view of a light emitting diode according to a second embodiment of the present invention. That is, the figure is a schematic sectional view of a top-type light emitting diode according to the present invention.

Referring to FIG. 8, the light emitting diode of the second embodiment is similar to that of the first embodiment except that a reflecting portion is formed on a substrate. Thus, only parts different from each other will be described below.

The light emitting diode comprises a substrate 210, lead terminals 230 and 235 formed on the substrate 210, a frame 290, a reflecting portion 240, a light emitting diode chip 220 mounted on the frame 290, and wires 270 for connecting the light emitting diode chip 220 to the lead terminals 230 and 235. Further, a fluorescent substance 250 for converting the wavelength of light generated from the light emitting diode chip 220 is mixed with an encapsulant and then applied to the frame 290 to form a molding portion 260. A peripheral molding portion 265 is formed on the light emitting diode chip 220 to protect the light emitting diode chip 220. In this case, the peripheral molding portion 265 is made of a predetermined resin, preferably, an epoxy resin or silicone resin.

Meanwhile, the reflecting portion 240 is formed to surround at least one light emitting diode chip 220 on the substrate 210. At this time, to enhance the luminance and condensing efficiency of light, the reflecting portion 240 may be formed in such a manner that an inner wall of the reflecting portion 240 surrounding the light emitting diode chip 220 has a predetermined slope.

Figure 9:
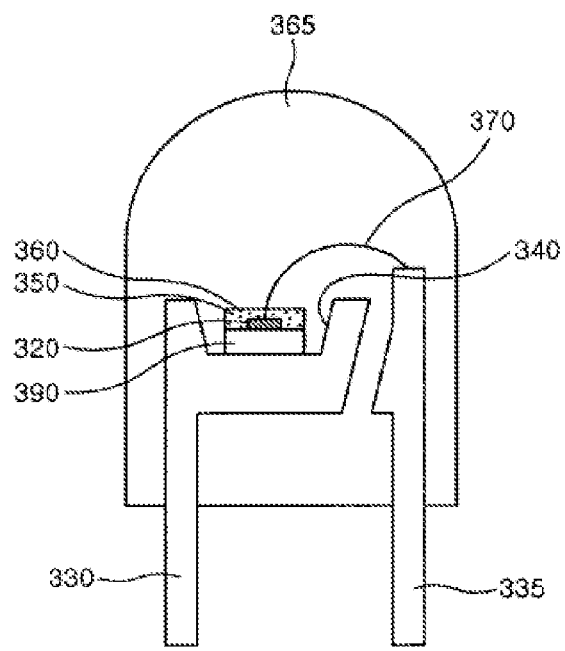
FIG. 9 is a sectional view of a light emitting diode according to a third embodiment of the present invention.

FIG. 9 is a sectional view of a light emitting diode according to a third embodiment of the present invention. That is, this figure is a schematic sectional view of a lamp-type light emitting diode according to the present invention.

Referring to FIG. 9, the light emitting diode comprises a first lead terminal 330 with a reflecting portion 340 at a top end thereof, and a second lead terminal 335 spaced apart by a predetermined distance from the first lead terminal 330. Further, a frame 390 is formed inside the reflecting portion 340 of the first lead terminal 330, and a light emitting diode chip 320 is mounted on the frame 390.

Furthermore, a fluorescent substance 350 for converting the wavelength of light generated from the light emitting diode chip 320 is mixed with an encapsulant and then applied to the frame 390 to form a molding portion 360. A peripheral molding portion 365 is formed on the light emitting diode chip 320 by applying a predetermined resin thereto and thermally curing the resin for a predetermined time so as to protect the light emitting diode chip 320. In this case, the peripheral molding portion 365 may comprise an epoxy resin or silicone resin.

Figure 10:
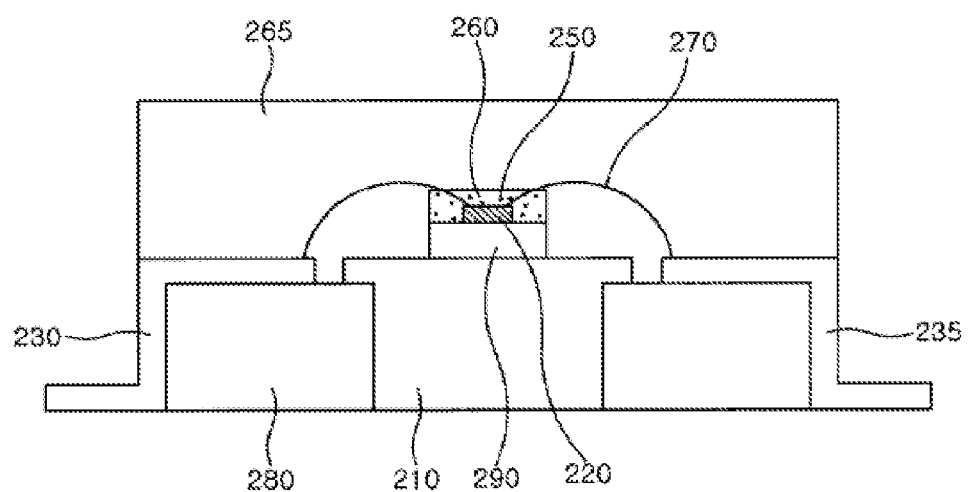
FIGS. 10 and 11 are sectional views of light emitting diodes according to fourth and fifth embodiments of the present invention, respectively.
Figure 11:
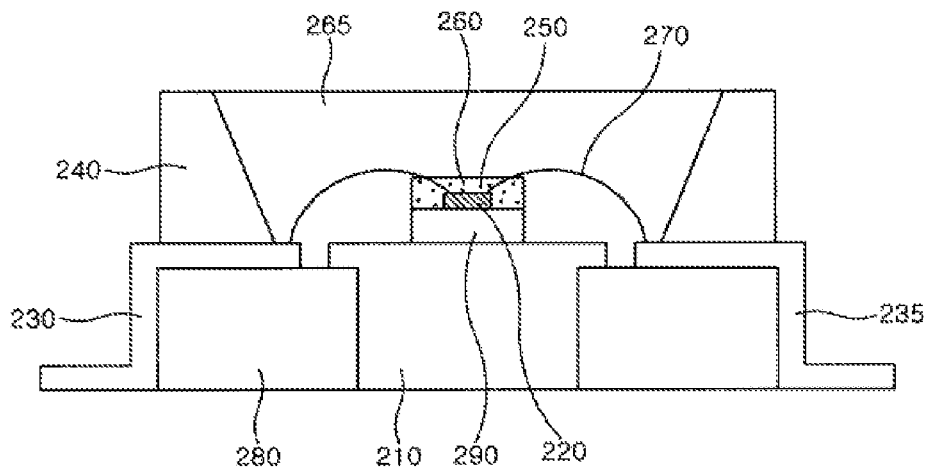

FIGS. 10 and 11 are sectional views of light emitting diodes according to fourth and fifth embodiments of the present invention. That is, the figures are schematic sectional views of light emitting diodes each of which has a housing.

The light emitting diode according to the fourth embodiment of the present invention shown in FIG. 10 is different from that of the first embodiment in that it further comprises a housing 280 for surrounding a substrate. However, remaining components thereof are identical to each other.

The light emitting diode according to the fifth embodiment of the present invention shown in FIG. 11 is different from that of the second embodiment in that it further comprises a housing 280 for surrounding a substrate. However, remaining components thereof are identical to each other.

Figure 12:
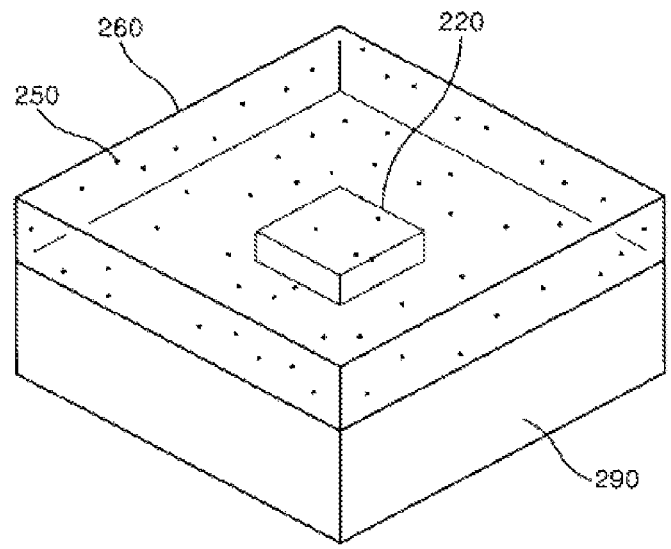
FIGS. 12 to 17 are views showing examples of a frame structure according to the present invention.
Figure 13:
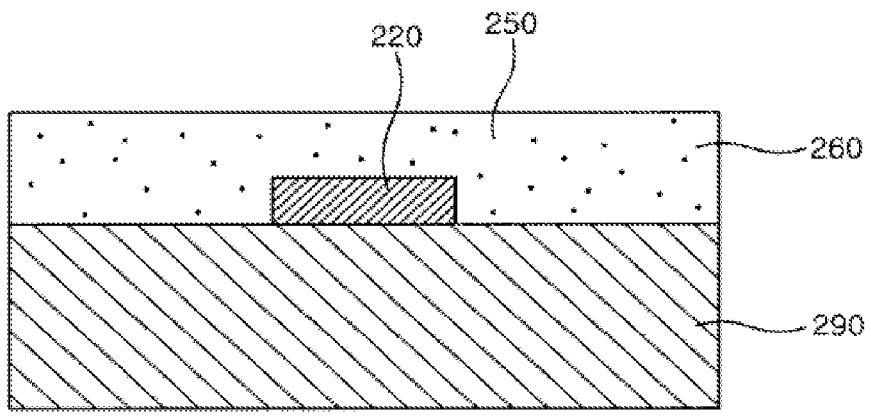
Figure 14:
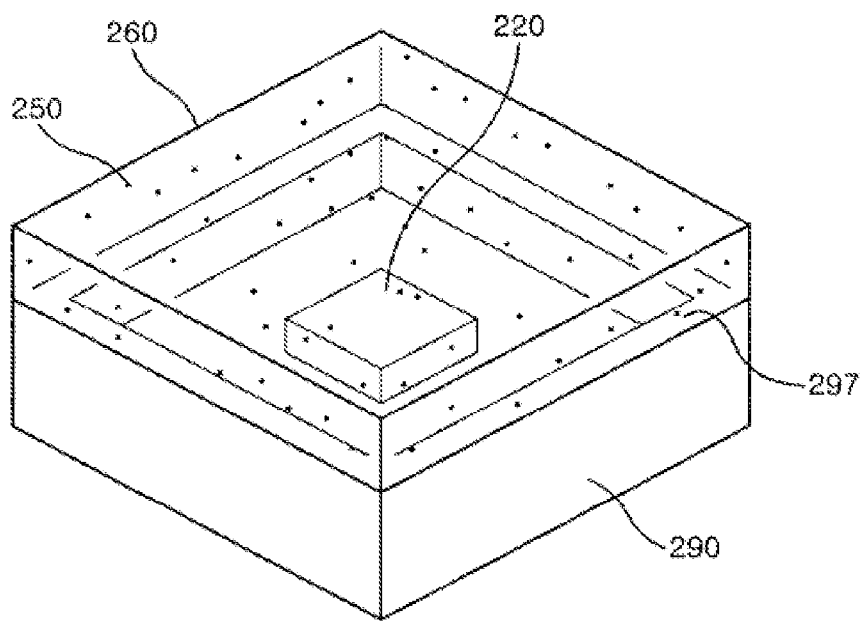
Figure 15:
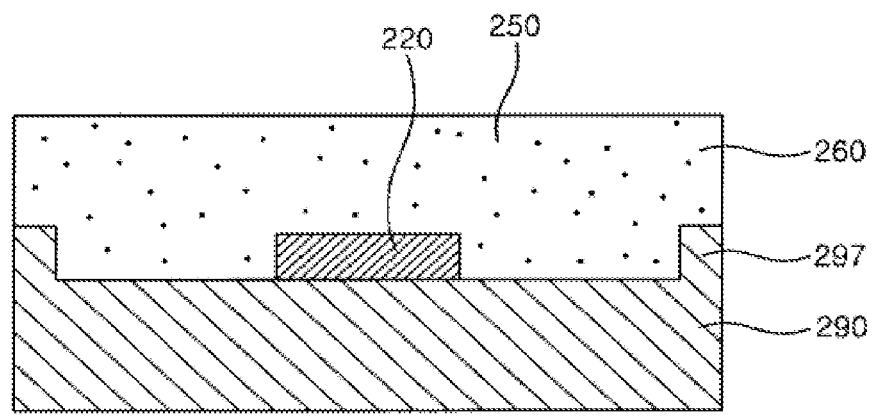
Figure 16:
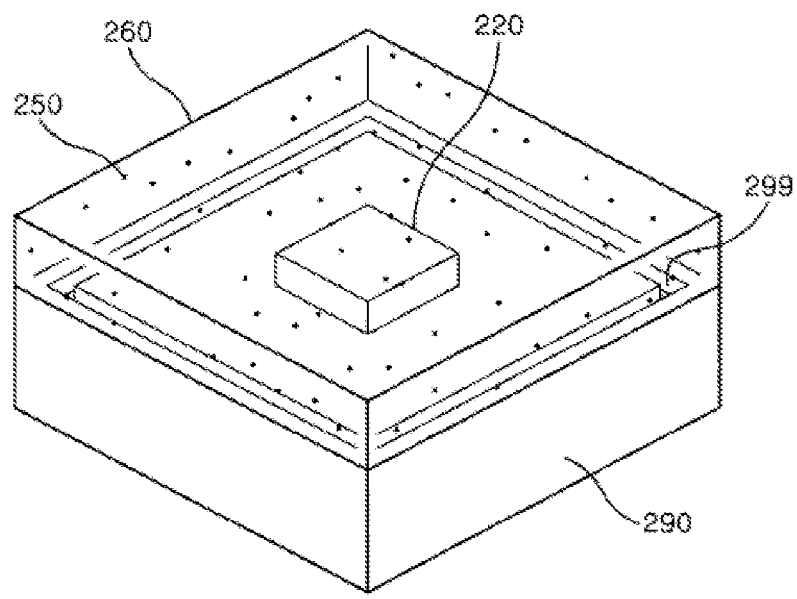
Figure 17:
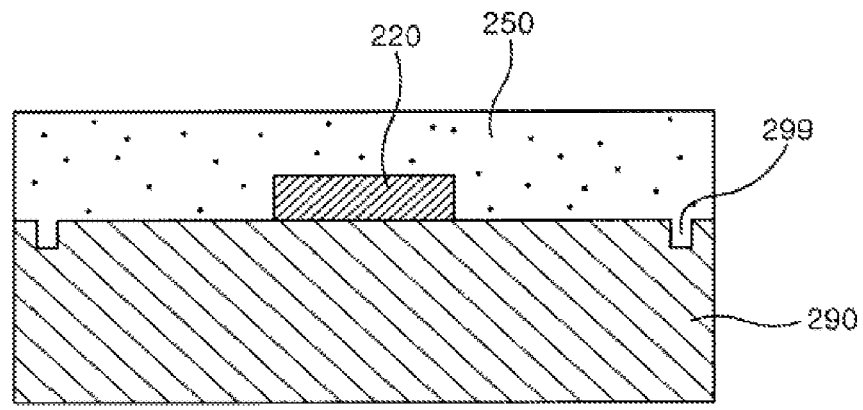

FIGS. 12 and 13 are a perspective view and a sectional view showing an example of a frame structure according to the present invention, respectively. FIGS. 14 and 15 are a perspective view and a sectional view showing another example of the frame structure according to the present invention. FIGS. 16 and 17 are a perspective view and a sectional view showing a further example of the frame structure according to the present invention.

Referring to FIGS. 12 and 13, the frame 290 is constructed in the same shape as the light emitting diode chip 220, i.e., in the form of a rectangle, to be sized about 1.5 or 2 times as large as that of the light emitting diode chip 220. Although the light emitting diode chip 220 and the frame 290 in this embodiment are constructed in the form of rectangles, they are not limited thereto but may be constructed in various forms. In this case, the frame 290 and the light emitting diode chip 220 are constructed to be in the same shape.

After a light emitting diode chip 220 is mounted on a central portion of a top surface of the frame 290 with the above mentioned shape and size, and a mixture of fluorescent substance and encapsulant is then dotted thereon, a molding portion 260 is constructed in the same shape as the frame 290. Thus, a uniform distance is established between the light emitting diode chip 220 and the molding portion 260. In other words, the molding portion 260 is constructed in the same shape of the light emitting diode chip 220.

Referring to FIGS. 14 and 15, a frame structure of this embodiment is similar to that shown in FIGS. 12 and 13 but is different therefrom only in that a barrier 297 with a predetermined height is formed along the periphery of the top surface of the frame 290.

The barrier 297 functions to lead the formation of the molding portion 260 using the mixture of fluorescent substance 250 and encapsulant such that the molding portion 260 has the same shape as the light emitting diode chip 220. At this time, the barrier 297 may be formed integrally with the frame 290.

Referring to FIGS. 16 and 17, a frame structure of this embodiment is similar to that shown in FIGS. 12 and 13 but is different therefrom only in that a groove 299 with a predetermined depth is formed along the periphery of the top surface of the frame 290.

Similarly to the barrier 297, the groove 299 functions to lead the formation of the molding portion 260 using the mixture of fluorescent substance 250 and encapsulant such that the molding portion 260 has the same shape as the light emitting diode chip 220.

Figure 18:
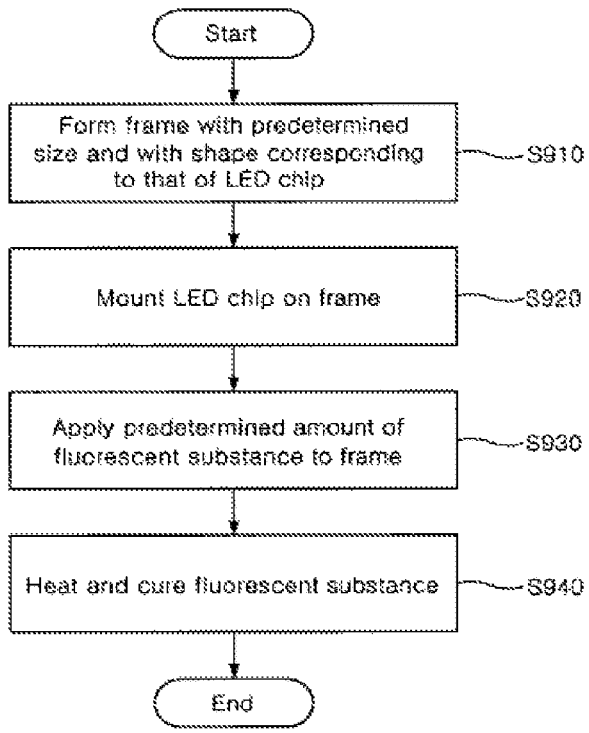
FIG. 18 is a flowchart illustrating a method of fabricating a light emitting diode according to the present invention.

FIG. 18 is a flowchart illustrating a method of fabricating a light emitting diode according to the present invention.

Referring to FIG. 18, a process of forming a frame with a predetermined size and the same shape as a light emitting diode chip is first performed (S910).

A light emitting diode chip is mounted on the frame formed in step S910 (S920).

Thereafter, a predetermined amount of fluorescent substance is applied to the frame (S930). At this time, the fluorescent substance is mixed with an encapsulant, e.g., a liquid epoxy resin or silicone resin, and then applied to the frame.

Meanwhile, although the frame is formed in the same shape as the light emitting diode chip as described above, the frame is formed to be larger than the light emitting diode chip. Further, a barrier with a predetermined height may be formed along the periphery of a top surface of the frame. Otherwise, a groove with a predetermined depth may be formed along the periphery of the top surface of the frame.

Thereafter, a process of heating and curing the fluorescent substance applied to the frame is then performed (S940).

The foregoing is merely the exemplary embodiments of the light emitting diode and the method of fabricating the same. The present invention is not limited to the embodiments. It will be readily understood by those skilled in the art that various modifications and changes can be made thereto without departing from the technical spirit and scope of the present invention defined by the appended claims. It is also apparent that the modifications and changes fall within the scope of the present invention.

Industrial Applicability

According to the present invention described above, a light emitting diode chip is mounted on a frame with a shape corresponding to that of the light emitting diode chip and a fluorescent substance is then dotted thereon, so that a uniform distance is established between the light emitting diode chip and molding portion, thereby reducing a color variation, i.e., generation of two or more different colors, and enhancing luminous efficiency.

What is claimed is:
1. A light emitting diode, comprising:
 a light emitting diode chip arranged on a first surface of a substrate;
 a housing arranged on the substrate, the housing comprising a lead electrically connected to the light emitting diode chip;

a first molding portion arranged on the light emitting diode chip, the first molding portion comprising a fluorescent substance; and a frame arranged between the substrate and the light emitting diode chip, wherein the lead comprises a step portion, and the step portion is exposed outside an outer surface of the housing, wherein the housing comprises a sidewall comprising a top surface, an inner surface extending from the top surface and facing the light emitting diode chip, and a plurality of interrupted grooves on the inner surface and facing the light emitting diode chip, wherein widths measured from a top view of first regions of the top surface respectively corresponding to the plurality of interrupted grooves are less than widths measured from a top view of second regions of the top surface disposed outside of the first regions, and wherein an outer surface of the first molding portion is substantially flush with an outer side of the surface of the frame.

2. The light emitting diode of claim 1, wherein a second surface of the substrate opposite to the first surface is exposed to the outside.

3. The light emitting diode of claim 2, wherein the lead comprises:
   a first surface arranged at the inner surface of the housing;
   a second surface exposed outside the outer surface of the housing; and
   a third surface connecting the first surface and the second surface,
   wherein the second surface is arranged on the same plane as the second surface of the substrate.

4. The light emitting diode of claim 1, wherein the substrate comprises a metal slug or a thermally conductive resin.

5. The light emitting diode of claim 1, further comprising a second molding portion arranged on the first molding portion and the substrate.

6. The light emitting diode of claim 5, wherein a plurality of interrupted grooves is arranged outside the outer surface of the second molding portion.

7. The light emitting diode of claim 1, further comprising a barrier arranged on an outer circumference of the frame, wherein the barrier comprises a height greater than a height of the frame.

8. The light emitting diode of claim 7, wherein the barrier is spaced at a uniform distance from the light emitting diode chip.

9. The light emitting diode of claim 8, wherein the barrier is integrally formed with the frame.

10. The light emitting diode of claim 1, further comprising a second groove arranged in a portion of the outer circumference of the frame.

11. The light emitting diode of claim 10, where the second groove is spaced at a uniform distance from the light emitting diode chip.

12. The light emitting diode of claim 1, wherein the frame is integrally formed with the substrate.

13. The light emitting diode of claim 1, wherein the first molding portion is arranged directly on the frame and the light emitting diode chip.

14. The light emitting diode of claim 13, further comprising a barrier arranged on an outer circumference of the frame, wherein the barrier comprises a height greater than a height of the frame.

15. The light emitting diode of claim 1, wherein the width of the first region of the housing increases towards the outer surface of the housing.

16. A light emitting diode, comprising:
   a light emitting diode chip arranged on a first surface of a substrate;
   a housing arranged on the substrate, the housing comprising a lead electrically connected to the light emitting diode chip; and
   a first molding portion arranged on the light emitting diode chip, the first molding portion comprising a fluorescent substance; and
   a frame arranged between the substrate and the light emitting diode chip,
   wherein the lead comprises a step portion, and the step portion is exposed outside an outer surface of the housing,
   wherein the housing comprises a sidewall comprising:
      a top surface; and
      an inner surface extending from the top surface and facing the light emitting diode chip,
   wherein the inner surface comprises a plurality of interrupted grooves disposed on the inner surface and facing the light emitting diode chip, and
   wherein an outer surface of the first molding portion is substantially flush with an outer side of the surface of the frame.

17. A light emitting diode, comprising:
   a light emitting diode chip arranged on a first surface of a substrate;
   a housing arranged on the substrate, the housing comprising a lead electrically connected to the light emitting diode chip;
   a first molding portion arranged on the light emitting diode chip, the first molding portion comprising a fluorescent substance;
   a frame arranged between the substrate and the light emitting diode chip; and
   a barrier arranged on an outer circumference of the frame, wherein the barrier comprises a height greater than a height of the frame,
   wherein the lead comprises a step portion, and the step portion is exposed outside an outer surface of the housing,
   wherein the housing comprises an inner surface comprising a slope and a top surface comprising a groove,
   wherein the first molding portion is arranged directly on the frame and the light emitting diode chip, and
   wherein an outer surface of the first molding portion, an outer surface of the barrier, and an outer surface of the frame are substantially flush with each other.

* * * * *